United States Patent
Daval (10) Patent No.: US 7,232,737 B2
(45) Date of Patent: Jun. 19, 2007

(54) TREATMENT OF A REMOVED LAYER OF SILICON-GERMANIUM

(75) Inventor: Nicolas Daval, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 174 days.

(21) Appl. No.: 11/145,482

(22) Filed: Jun. 2, 2005

(65) Prior Publication Data

US 2006/0160328 A1   Jul. 20, 2006

(30) Foreign Application Priority Data

Jan. 19, 2005   (FR) .................................. 05 00524

(51) Int. Cl.
*H01L 21/30* (2006.01)
*H01L 21/46* (2006.01)

(52) U.S. Cl. ...................... 438/455; 438/458; 438/459; 438/933; 257/E21.211

(58) Field of Classification Search ................ 438/455, 438/458
See application file for complete search history.

(56) References Cited

U.S. PATENT DOCUMENTS

| 5,461,243 | A | 10/1995 | Ek et al. .................... 257/190 |
| 5,882,987 | A | 3/1999 | Srikrishnan ................ 438/458 |
| 6,059,895 | A | 5/2000 | Chu et al. .................. 148/33.1 |
| 6,100,166 | A | 8/2000 | Sakaguchi et al. .......... 438/455 |
| 6,297,147 | B1 * | 10/2001 | Yang et al. ................. 438/627 |
| 6,352,942 | B1 | 3/2002 | Luan et al. ................. 438/770 |
| 6,524,935 | B1 * | 2/2003 | Canaperi et al. ............ 438/478 |
| 6,573,126 | B2 * | 6/2003 | Cheng et al. ............... 438/149 |
| 6,613,678 | B1 | 9/2003 | Sakaguchi et al. .......... 438/695 |

(Continued)

FOREIGN PATENT DOCUMENTS

EP   1 248 294 A2   10/2002

(Continued)

OTHER PUBLICATIONS

T. Tezuka et al., XP001109835, High-Performance Strained Si-on-Insulator MOSFETs by Novel Fabrication Processes Ultilizing Ge-Condensation Technique, Symposium On VLSI Tech., Digest of Technical Papers, Honolulu, NY:IEEE US, pp. 96-97 (2002).

(Continued)

*Primary Examiner*—Walter Lindsay, Jr.
*Assistant Examiner*—Angel Roman
(74) *Attorney, Agent, or Firm*—Winston & Strawn LLP (57) ABSTRACT

A method of forming a structure that includes a removed layer taken from a donor wafer donor wafer that includes a first layer of $Si_{1-x}Ge_x$ and a second layer of $Si_{1-y}Ge_y$. The method includes implanting atomic species into the donor wafer to form a zone of weakness in the first layer; bonding the donor wafer to a receiver wafer; detaching the second layer and a portion of the first layer from the donor wafer by supplying energy sufficient to cause cleavage and form an intermediate structure thereof conducting a rapid thermal anneal of the intermediate structure at a temperature of about 1000° C. or more for less than 5 minutes; and removing by selective etching any remaining portions of the first layer of the intermediate structure to provide a semiconductor structure that has the second layer on the receiving wafer.

20 Claims, 3 Drawing Sheets

U.S. PATENT DOCUMENTS

| | | | |
|---|---|---|---|
| 6,703,144 B2 * | 3/2004 | Fitzgerald | 428/641 |
| 6,953,736 B2 * | 10/2005 | Ghyselen et al. | 438/458 |
| 7,008,857 B2 * | 3/2006 | Ghyselen et al. | 438/455 |
| 7,018,910 B2 * | 3/2006 | Ghyselen et al. | 438/458 |
| 7,081,399 B2 * | 7/2006 | Maleville et al. | 438/458 |
| 2002/0061631 A1 | 5/2002 | Miyabayashi et al. | 438/478 |
| 2002/0072130 A1 | 6/2002 | Cheng et al. | 438/10 |
| 2002/0146892 A1 | 10/2002 | Notsu et al. | 438/455 |
| 2002/0168864 A1 | 11/2002 | Cheng et al. | 438/725 |
| 2003/0013305 A1 | 1/2003 | Suggii et al. | 438/689 |
| 2004/0053477 A1 | 3/2004 | Ghyselen et al. | |
| 2004/0060900 A1 | 4/2004 | Waldhaurer et al. | 216/2 |
| 2004/0151483 A1 | 8/2004 | Neyret et al. | 392/416 |
| 2004/0195656 A1 | 10/2004 | Ghyselen et al. | 257/616 |
| 2005/0167002 A1 * | 8/2005 | Ghyselen et al. | 148/33 |
| 2005/0170611 A1 * | 8/2005 | Ghyselen et al. | 438/458 |
| 2005/0191825 A1 * | 9/2005 | Ghyselen et al. | 438/458 |
| 2005/0196937 A1 * | 9/2005 | Daval et al. | 438/455 |
| 2005/0245049 A1 * | 11/2005 | Akatsu et al. | 438/458 |
| 2006/0014363 A1 * | 1/2006 | Daval et al. | 438/458 |
| 2006/0088979 A1 * | 4/2006 | Aulnette et al. | 438/458 |
| 2006/0223283 A1 * | 10/2006 | Maleville et al. | 438/458 |

FOREIGN PATENT DOCUMENTS

| | | |
|---|---|---|
| FR | 2797174 | 2/2001 |
| FR | 2797713 | 2/2001 |
| FR | 2858462 | 2/2005 |
| WO | WO 99/53539 | 10/1999 |
| WO | WO/0243153 A1 | 5/2002 |
| WO | WO 03/103026 A1 | 12/2003 |
| WO | WO 2004/079801 | 9/2004 |

OTHER PUBLICATIONS

S. Mantl et al., "Strain relaxation of epitaxial SiGe layers on Si(100) improved by hydrogen implantation" Nuclear Instruments and Methods in Physics Research, vol. 147, No. 1-4, pp. 29-34 (1999).

B. Hollander et al., "Strain relaxation of pseudomorphic $Si_{1-x}Ge$ JSi(100) heterostructures after hydrogen of helium ion implantation for virtual substrate fabrication", Nuclear Instruments and Methods in Physics Research B 175-177 (2001) 357-367 (2001).

Friedrich Schaffler, "High-mobility Si and Ge Structures", Semicond. Sci. Technol., vol. 12, pp. 1515-1548 (1997).

Q. Y. Tong et al "Extracts of Semi-conductor on wafer bonding", Science and Technology, Interscience Technology, Wiley Interscience publication, Johnson Wiley & Sons, Inc.

J.P. Collinge, :"Silicon-on-insulator technology", Materials to VLSI, 2nd Edition, Kluwer Academic Publisher, pp. 50-51.

M. Grihlionr et al., "Diffusion of Ge in $Si_{1-x}/Ge_x/Si$ single quantum wells in inert and oxidizing ambients", Journal of Applied Physics, vol. 88, No. 3, (2000).

* cited by examiner

FIG.5

# TREATMENT OF A REMOVED LAYER OF SILICON-GERMANIUM

BACKGROUND OF THE INVENTION

The present invention relates a method of forming a structure comprising a removed layer of semiconductor material taken from a donor wafer, the donor wafer comprising, prior to removal, a first layer formed of $Si_{1-x}Ge_x$ and a layer of $Si_{1-y}Ge_y$ on the first layer, with x and y respectively being in the range of 0 to 1 and x being different from y. This method comprises the following steps in succession:

a) implanting atomic species to form a zone of weakness beneath the second layer;
b) bonding the donor wafer to a receiver wafer;
c) supplying thermal and/or mechanical energy to detach the removed layer from the donor wafer at the zone of weakness;
d) treating the removed layer.

The preferred type of layer removal uses a SMART-CUT® technique, a layer transfer method that is well known to a skilled person. One example of employing such a removal method is described in U.S. patent publication 2004/0053477 in which the crystallographic structure of the second layer is elastically strained by the structure of the first layer.

Step d) for treating the removed layers often has to be carried out to lift off defective zones and to reduce surface roughness principally resulting from carrying out steps a) and c). The thickness of the defective zone is typically about 150 nanometers (nm) for atomic implantation of hydrogen ions. As an example, it is possible to perform mechanical polishing or chemical-mechanical planarization (CMP, chemical-mechanical polishing) in order to eliminate surface roughness, and/or steps of sacrificially oxidizing defective zones.

Since bonding in accordance with step b) is conventionally carried out via a layer of electrically insulating material, a semiconductor-on-insulator structure can thus be produced, such as a $Si_{1-x}Ge_x/Si_{1-y}Ge_y$ on insulator structure. As disclosed in U.S. patent publication 2004/0053477, a step subsequent to step d) can be carried out to lift off the remaining portion of the first layer, hence retaining only the second layer on the receiver wafer. Thus, a $Si_{1-x}Ge_x$ on insulator structure can be produced.

The operation for lifting off the remaining portion of the first layer can be carried out effectively by selective chemical etching using suitable etching agents. Selective chemical etching can in the end produce the desired layer with a good surface quality without too great a risk of damaging it (which could be the case if, e.g., only a single polish was to be carried out). But selective chemical etching necessitates prior preparation of the etching surface, typically carried out using mechanical polishing means. That preparation step remains necessary to reduce the severe roughness which could subsequently cause locally over-inhomogeneous etching, which in turn could create through defects or holes in the second layer. The successive actions of polishing and chemical etching, however, render the post-detachment finishing step (as well as the whole of the removal procedure) long, complex, and expensive.

Furthermore, chemical etching can in some cases result in problems with at least partial unbonding or disbonding of the bonding interface. In particular, it may delaminate an edge or side of the bonding layer, i.e., attack the layer where it crops out from the side of the resulting structure. An example that can be mentioned is hydrofluoric acid ("HF") treatment of a sSOI (strained silicon on insulator) structure comprising $SiO_2$ buried under strained Si, or $H_2O_2$:HF:HAc treatment (HAc being the abbreviation for acetic acid) on a sSi/SiGeOI (strained silicon on SiGe on insulator) structure, where the layers of SiGe and buried $SiO_2$ are liable to be etched beneath the layer of strained Si. Thus as regards the quality of the final product, the results obtained are less than satisfactory.

One alternative which could be envisaged to overcome that problem would be to dilute the etching agents further to enable their action to be better controlled, but this requires a longer procedure to etch the surface due to the use of dilute acids. That solution is not satisfactory since by substantially increasing the duration of the procedure, it still does not completely solve the problem of delamination at the edges or sides of the resulting structure.

A further solution which could be envisaged would be to reinforce the bonding interface prior to etching to render that interface more resistant to chemical agents. To this end, a post-detachment stabilizing heat treatment carried out at about 1000° C. or more for several hours could be envisaged, but that solution, which is well known when producing a SOI (silicon on insulator) structure, is not suitable when transferring heterogeneous layers of $Si_{1-x}Ge_x$ and $Si_{1-y}Ge_y$. In fact, such a heat treatment causes germanium to diffuse from the layer having the highest Ge content towards the layer having the lowest Ge content, thus tending to homogenize the Ge content over the two layers so that the physical and electrical properties of those two layers can no longer be differentiated. If the two layers become essentially identical, then subsequent etching can no longer be selective and it is not possible to remove only the first layer without removing part of the second layer.

Further, it is frequently desirable to avoid any diffusion from one layer to another. This is particularly the case when the second layer is formed of strained Si (i.e., $Si_{1-y}Ge_y$ where y is 0) and when a final sSOI (strained SOI) structure is to be obtained to fully benefit from the electrical properties of the structure (e.g., increased charge mobility). Thus, the treatment temperature is limited by the diffusion of germanium from one layer to the other (with the diffusion typically commencing at about 800° C.), and low temperature reinforcement can thus only be partially effective. Thus, the delamination problem persists even with such reinforcement.

The present invention now seeks to avoid these problems by providing a new process for treating layers to be removed in a manner that does not detrimentally affect the remainder of the structure.

SUMMARY OF THE INVENTION

Accordingly, the invention now avoids delamination at the edge or side of the bonding layer when carrying out finishing chemical etching of the removed layer. A further benefit of the invention is to reduce the duration, economic cost, and number of treatments after step c) carried out on the removed layers, and in particular to dispense with the use of mechanical polishing. A still further advantage of the invention is to produce a structure such as a semiconductor-on-insulator structure comprising a removed layer that includes a material which is less stable than Si, such as strained Si or SiGe. A yet still further benefit of the invention is to reduce the quantity of material sacrificed during treating the removed layer. Thus, the invention proposes a simple method for treating the removed layer which readily integrates into the whole removal method employing the SMART-CUT® technique.

To achieve these benefits, the invention relates to a method for forming a semiconductor structure, which comprises providing a donor wafer that includes a first layer of $Si_{1-x}Ge_x$ and a second layer of $Si_{1-y}Ge_y$ located on the first layer, with x and y respectively, being in the range of 0 to 1, and x being different than y; implanting atomic species into the donor wafer to form a zone of weakness in the first layer; bonding the donor wafer to a receiver wafer; detaching the second layer and a portion of the first layer from the donor wafer by supplying energy to bonded wafers sufficient to cause cleavage at the zone of weakness to form an intermediate structure thereof; conducting a rapid thermal anneal ("RTA") of the intermediate structure at a temperature of about 1000° C. or more for a period of time not exceeding 5 minutes; and removing any remaining portions of the first layer of the intermediate structure to provide a semiconductor structure comprising the second layer on the receiving wafer. Preferably, the remaining portions of the first layer are removed from the intermediate structure by selective etching.

BRIEF DESCRIPTION OF THE DRAWINGS

Further characteristics, benefits, and advantages of the invention become apparent from the following detailed description of preferred implementations of the method, given by way of non limiting examples, and made with reference to the accompanying drawings in which.

DETAILED DESCRIPTION OF THE PREFERRED EMBODIMENTS

The present invention now provides, in a first preferred embodiment, a method of forming a structure comprising a removed layer of semiconductor material taken from a donor wafer, the donor wafer comprising, prior to removal, a first layer formed of $Si_{1-x}Ge_x$ and a second layer formed of $Si_{1-y}Ge_y$ on the first layer, where, as noted, x and y respectively are in the range of 0 to 1, and with x being different from y. This method preferably comprises the following steps in succession:

a) implanting atomic species to form a zone of weakness beneath the second layer and in the first layer;

b) bonding the donor wafer to a receiver wafer;

c) supplying energy to detach removed layers from the donor wafer at the zone of weakness;

d) conducting a RTA carried out at a temperature of about 1000° C. or more for a period not exceeding 5 minutes; and then e) conducting selective etching of the remaining portion of the first layer as opposed to the second layer to obtain the semiconductor structure.

There are a number of possible variations of the invention including the following. Preferably, step d) is carried out at a temperature in the range from about 1000° C. to about 1200° C. for about 10 seconds to about 30 seconds, and more preferably, step d) is carried out at a temperature of about 1100° C. for about 10 seconds. Advantageously, step d) is carried out in a reducing atmosphere, such as one that includes argon or a mixture of argon and hydrogen.

As noted, the preferred way to remove the remaining portion of the first layer in the intermediate structure is by selective etching, but it is also possible to conduct sacrificial oxidation between step c) and step d) to remove some of the remaining portion of the first layer. The use of this process avoids the need to conduct mechanical polishing after step c).

The bond between the wafers can be enhanced by conducting a plasma activation of at least one bonding surface is carried out prior to step b). For example, a heat treatment at the times and temperatures specified herein can be carried out after step b) to reinforce the bonding between the wafers. Alternatively, a step of forming a bonding layer on the surface(s) of the donor or receiver wafers can be carried out prior to step b) for this purpose, with the bonding layer comprising an electrically insulating material such as $SiO_2$, $Si_3N_4$, or $Si_xO_yN_z$.

The atomic species implanted during step a) can be constituted by a single atomic element, such as and preferably hydrogen, or it can comprise two distinct atomic elements, preferably hydrogen and helium, so that step a) thereby constitutes co-implantation.

To thicken the second layer, the method further comprises crystal growth of $Si_{1-y}Ge_y$ on the second layer after step e). The second layer provides a base or seed layer that facilitates the growth of this additional material. Typically, the second layer is formed of elastically strained $Si_{1-y}Ge_y$.

The donor wafer may also include a third layer of $Si_{1-x}Ge_x$ on the second layer, so that the second and third layers are transferred along with the remaining portions of the first layer. Then after removal of the first layer, two different layers of SiGe remain on the receiving wafer in the final semiconductor structure.

The donor wafer preferably comprises a support substrate formed of bulk Si, a SiGe buffer structure and a multilayer structure comprising first layers of $Si_{1-x}Ge_x$ alternating with the second layers of strained $Si_{1-y}Ge_y$ layers to enable a plurality of removals to be made from the same donor wafer. Advantageously, each layer of strained $Si_{1-y}Ge_y$ is thicker than the critical equilibrium thickness.

In accordance with another preferred embodiment, the invention proposes the use of this method of forming a structure to the formation of a semiconductor-on-insulator structure.

There follow examples of methods of the invention and uses of the invention, based on layers removed by the SMART-CUT® technique which layers are formed of a type IV material or alloy, and in particular of Si and SiGe.

FIGS. 1a to 1e show a first, preferred method of removing a first layer 1 formed of $Si_{1-x}Ge_x$ (in which x is between 0 and 1) and a second layer 2 formed of $Si_{1-y}Ge_y$ (in which y is between 0 and 1 and is different from x), from a donor wafer 10, to transfer them to a receiver wafer 20, in accordance with the invention.

Figure 1A:
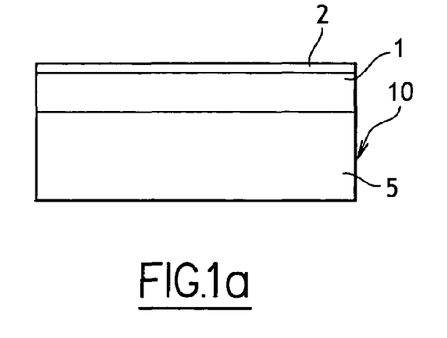
FIGS. 1a to 1f are diagrams of the different steps of a method in accordance with the invention to form a structure comprising a layer removed by a SMART-CUT® process.

FIG. 1a shows a donor wafer 10 comprising the first layer 1 formed of $Si_{1-x}Ge_x$ and the second layer 2 formed of $Si_{1-y}Ge_y$ to be removed. As is conventional, the donor wafer 10 including $Si_{1-x}Ge_x$ comprises a bulk substrate 5 formed of Si on which there has been formed, for example by crystal growth, a buffer structure formed of SiGe (not shown) composed of different layers. In particular, this buffer structure may have a gradual change in its germanium content from 0% at the bulk Si substrate to about 100% at the interface with the first layer 1 formed of $Si_{1-x}Ge_x$. That layer too is preferably formed by crystal growth. The selected thickness of the $Si_{1-x}Ge_x$ layer can be about 1 micrometer, for example.

A second layer of $Si_{1-y}Ge_y$ is formed on the first layer 1 that is already formed of $Si_{1-x}Ge_x$. In a first case, the second layer is grown in situ, continuing on directly from the formation of the first layer 1. In a second case, the second layer 2 is grown after a brief but optional step of preparing the surface of the first layer 1, for example by CMP polishing.

The second layer 2 is advantageously formed by epitaxial growth using known techniques such as CVD and MEE (chemical vapor deposition and molecular beam epitaxy). Thus, for a first layer 1 formed of $Si_{0.8}Ge_{0.2}$ and a second layer formed of strained Si (i.e., a layer of $Si_{1-y}Ge_y$ where y is 0), a second layer having a thickness in the range from about 100 Ångströms (Å) to about 800 Å can be formed.

Given that the concentration of silicon in the two layers 1 and 2 is different, the second layer 2 is thus strained by the first layer 1 to render its lattice parameter substantially identical to that of its growth substrate, thus giving it internal elastic strains. The internal strains are tensile if the amount of silicon in the alloy of the second layer 2 is greater than that of the first layer 1 and compressive in the opposite case. A fairly thin second layer 2 has to be formed: too thick a layer, above a critical equilibrium thickness, could cause relaxation of the strain in the thickness of that film towards the nominal lattice parameter of $Si_{1-y}Ge_y$ and/or could cause defects to be generated. This is generally known by the skilled artisan, but reference should be made to the document entitled "High mobility Si and Ge structures" by Friedrich Schäffler (Semiconductor Science Technology, 12 (1997) 1515–1549) for further details regarding this subject if necessary. In the particular case of depositing a strained material at a sufficiently low temperature, it may become possible to form the second strained layer 2 with a thickness that is greater than the critical equilibrium thickness, as discussed below.

Figure 1B:
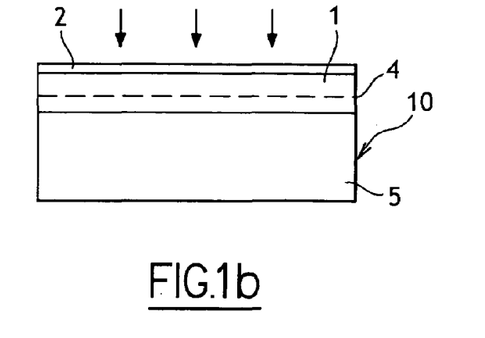

Referring now to FIG. 1b, a zone of weakness 4 is then formed in the donor wafer 10 beneath the second layer 2. In particular, the implantation can be made in the first layer 1 of $Si_{1-x}Ge_x$ (as shown in FIG. 1b). This zone of weakness 4 is formed by implanting atomic species into the first layer with the dose, nature, and energy of the atomic species being selected to determine a desired implantation depth and degree of weakness. In particular, the implantation energy is selected and determined so that the zone of weakness is formed beneath the second layer 2. For a first layer 1 having a thickness of about 0.5 micrometers or more and a second layer 2 having a thickness in the range from about 100 Å to about 800 Å, for example about 200 Å, the zone of weakness 4 can be formed between about 1500 Å and about 3000 Å, more particularly at about 2000 Å.

As an example, it is possible to implant hydrogen species at an energy in the range 20 kiloelectron volts (keV) to 80 kV and at a dose in the range $3\times10^{16}$ atoms per square centimeter (atoms/cm$^2$) to $10\times10^{16}$ atoms/cm$^2$, more particularly at an energy of about 30 keV and at a dose of about $6\times10^{16}$ atoms/cm$^2$). An implantation depth on the order of 1000 Å to 5000 Å is thus obtained.

Figure 1C:
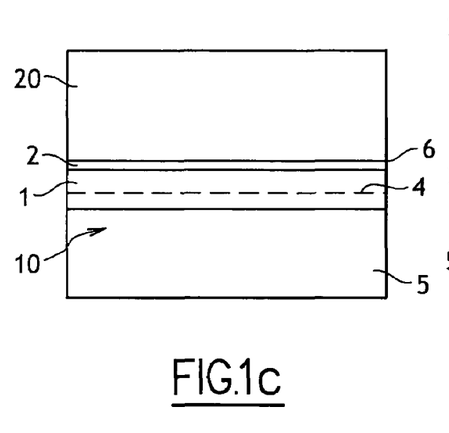

Optionally, the parameters determining the implanting atomic species are adjusted to minimize the roughness appearing at the zone of weakness 4 after detachment. In fact, the degree of post-detachment roughness is partially linked to these parameters. Thus, it is possible to select co-implanting atomic species, such as co-implantation of hydrogen and helium although argon or other inert gases can be used if desired. In the case of co-implantation, it has been noticed that the zone of weakness 4 is often thinner than in the case of simple implantation (see in particular U.S. patent application Ser. No. 11/059,122 filed Feb. 16, 2005, the entire content of which is expressly incorporated by reference herein to the extent necessary to understand this feature of the invention). In the case of co-implantation with helium at about $1\times10^{16}$/cm$^2$ and at an energy in the range 20 keV to 80 keV and hydrogen at $1\times10^{16}$/cm$^2$ and at an energy in the range 20 keV to 80 keV, it is possible to obtain an implantation depth of the order of 1000 Å to 5000 Å. Referring to FIG. 1c, a step of bonding a receiver wafer 20 with the face of the donor wafer 10 that has undergone implantation is carried out.

The receiver wafer 20 may be produced from bulk Si or from other materials.

Bonding per se may be carried out in the first place by molecular bonding, taking into account the hydrophilic nature of each of the two surfaces to be bonded. Prior to the bonding step, a bonding layer may be formed, such as a layer comprising $SiO_2$, $Si_3N_4$, $Si_{1-x}Ge_x$, on one and/or the other of the respective surfaces to be bonded. The technique used to form the bonding layer may be deposition, in order to avoid any deterioration of the strains in the second layer 2 or any consequent diffusion in the first layer.

Prior to bringing the receiver wafer 20 into contact with the donor wafer 10, at least one of the surfaces to be bonded can optionally be prepared using known techniques for surface cleaning and preparing, such as SC1 and SC2 solutions, ozone-containing solutions, or others. It is also possible to carry out plasma activation of one or both bonding surfaces just prior to carrying out bonding, which principally allows the future bonding interface to be reinforced without carrying out high temperature heat treatment. In particular, plasma activation can be carried out so that in the end, after bonding and after removal, the bonding energy is about 0.8 joules per square meter (J/m$^2$) or more. The plasma can, for example, be obtained from an inert gas such as argon or nitrogen or from an oxidizing gas such as oxygen. Optionally, a low temperature annealing heat treatment (800° C. or less) may be carried out prior to bonding, to further reinforce the bonding interface.

Figure 1D:
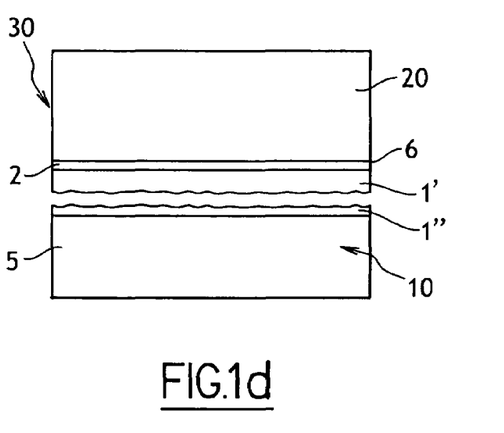
Figure 1E:
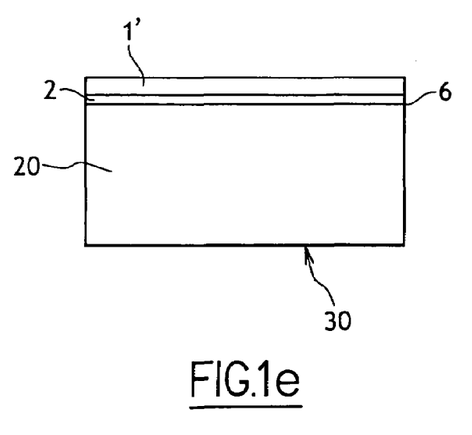

FIG. 1d shows detachment of the removed layers at the zone of weakness 4 by supplying thermal and/or mechanical energy sufficient to break the weak bonds at the zone of weakness 4 and thereby to detach the donor wafer 10 into a first portion 10' comprising a remainder of the first layer 1" and into a second portion 30 comprising the other portion of the first layer 1' and the second layer 2. The thermal energy may then be sufficient to cause, at the zone of weakness 4, thermal effects on the gaseous species which are enclosed therein, causing rupture of weak bonds.

Detachment may be carried out at temperatures in the range from about 300° C. to about 600° C. for a longer or shorter time period, depending respectively on whether the temperature is low or high. As an example, for a layer to be removed formed of $Si_{1-x}Ge_x$ and $Si_{1-y}Ge_y$, it is possible to carry out heat treatment at a temperature of about 500° C. to about 600° C. for a period of 15 minutes to 30 minutes up to 2 hours, more particularly at about 600° C.

When detachment is carried out solely by heat treatment, detachment may occur without necessarily withdrawing contact with the remaining portion of the donor wafer 10'. In this case, and optionally, a new heat treatment may be carried out following detachment, without removing the wafers from the furnace (in which the detachment heat treatment has been carried out) and without carrying out additional operations which would take more time and would necessitate using appropriate equipment. Further, the remaining portion of the donor wafer 10' protects the removed first and second layers 1' and 2 against possible contaminants, oxidants, or other species, which offers the possibility of carrying out the new heat treatment in different atmospheres.

Heat treatment can also clearly be carried out after the wafers have been physically separated (and removed from the detachment furnace). The heat treatment can be carried out in addition to, or instead of, any plasma activation carried out prior to bonding. In all cases, the heat treatment for reinforcing the bonding interface 6 is carried out at a temperature in the range from about 350° C. to about 800° C., in particular in the range from about 350° C. to about 700° C., more particularly at about 600° C., maintained for about 30 minutes to about 4 hours, and is carried out so as to reinforce bonding sufficiently (and thus avoid the risk of delaminating the side during the selective etching to be carried out following removal).

In accordance with the invention, following detachment; with or without the preceding step of reinforcing the bonding interface, the RTA is then carried out at a temperature of 1000° C. or more, for a period that does not exceed about 5 minutes. The RTA is preferably carried out in a reducing atmosphere, such as an atmosphere of argon and hydrogen or argon alone. As examples, the RTA may be carried out between about 1000° C. and about 1200° C. for about 10 seconds to about 30 seconds, in particular at about 1100° C. for about 10 seconds. The skilled artisan can conduct routine tests to determine the optimum temperature and time period for this treatment in order to achieve the results desired.

The temperature of 1000° C. or more is a temperature which is not conventionally used when in the presence of two layers 1 and 2 having different Ge. concentrations. In fact, it has been recognized (see, for example, the document by M. Griglione et al. entitled "Diffusion of Ge in $Si_{1-x}Ge_x/$ Si single quantum wells in inert and oxidizing ambients" (Journal of Applied Physics, vol 88, n° 3, Aug. 1, 2000) that heat treatments carried out at temperatures which would cause diffusion of germanium from the layer with the highest Ge concentration to the layer with the lowest concentration would tend to homogenize the Ge content over the two layers and thus the physical and electrical properties of the two layers would no longer be distinguished. This diffusion is undesirable in the context of the invention, as well as in the majority of conventional methods, in particular because differentiation of the layers 1' and 2 will allow subsequent selective etching of the first layer 1' as opposed to the second layer 2 to be carried out. For this reason, known methods, as described above, have been carried out using techniques that remain below 1000° C., and more particularly below 800° C. (see in particular U.S. patent application Ser. No. 11/059, 122).

A series of studies conducted on $Si_{1-x}Ge_x$/strained $Si_{1-y}Ge_y/SiO_2$/bulk Si wafer structures obtained just after detachment show that the diffusion of Ge during treatment at 800° C. or more is not as marked as was proposed earlier. In particular, it now has been found that the RTA as described herein can thus be carried out without substantial diffusion of germanium between the first layer 1' and the second layer 2.

Figure 4:
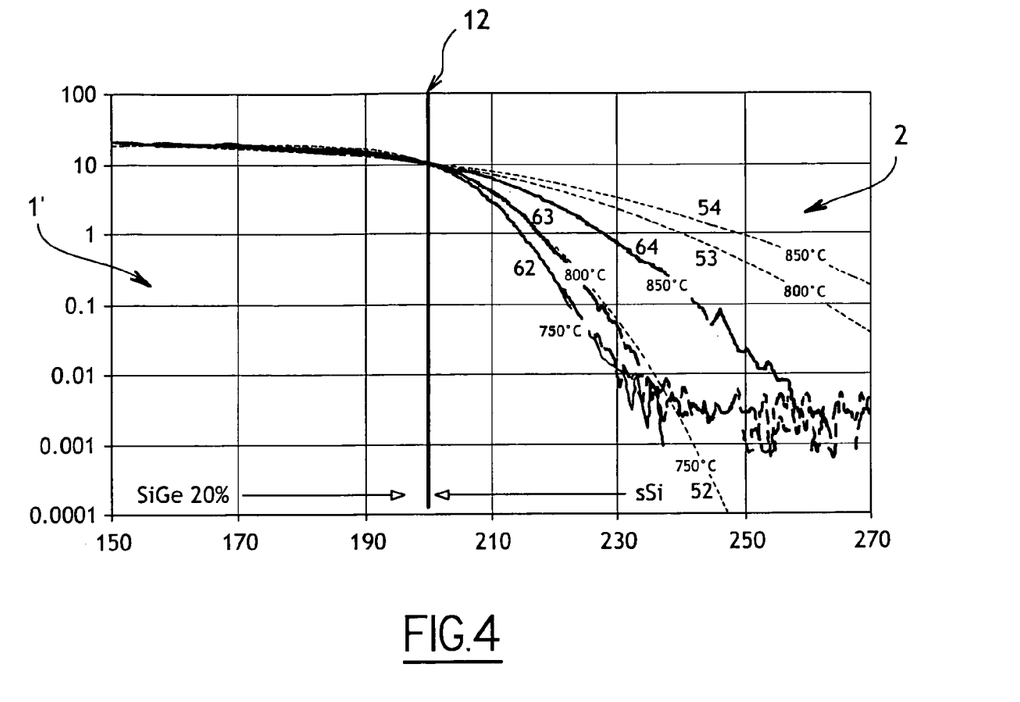
FIG. 4 shows the results of measurements carried out by secondary ion mass spectrometry to determine the concentration of germanium in a layer of strained silicon taken off in accordance with the invention, compared with concentrations of germanium in Si (unstrained) calculated from diffusion constants taken from the literature.

FIG. 4 shows a series of results from these studies. The measurements were carried out on structures 30 each similar to the structure 30 shown in FIG. 1e, obtained after detaching removed layers 1' and 2. In the context of this study, the first layer 1' was formed of 20% germanium (i.e., x=0.2) and was about 200 Å thick, and the second layer 2 was formed of strained silicon (i.e., y=0) and was about 200 Å thick. The abscissa of the graph of FIG. 4 shows the probed depth in the test samples beneath the free surface of the first layer 1'.

FIG. 4 is divided into a left hand portion 1' representing the first layer 1' and a right hand portion 2 representing the second layer 2 separated by a vertical line 12 representing the interface between the first layer 1' and the second layer 2. The "y" axis of FIG. 4 shows the concentration of germanium found by the measurements.

The measurements were carried out by secondary ion mass spectrometry on three samples after they had undergone heat treatments at temperatures of 750° C., 800° C. and 850° C. for four hours; the respective results are shown by diffusion profiles 62, 63, and 64. In accordance with that observed in the prior art, it has been observed that the higher the temperature is raised from about 800° C., the greater the diffusion of germanium in the thickness of the layer 2 of silicon subjacent to the layer 1' of $Si_{0.8}Ge_{0.2}$.

FIG. 4 also comprises diffusion profiles calculated theoretically from data provided in the M. Griglione et al. article previously mentioned herein, in which a study of a layer of relaxed silicon/$Si_{0.85}Ge_{0.15}$ was carried out. The diffusion profiles 52, 53, 54 were then found after integrating heat treatments at respective temperatures of 750° C., 800° C., 850° C. for four hours into the calculations. By respectively comparing the measured diffusion profiles 62, 63, 64 and the corresponding theoretical diffusion profiles 52, 53, 54, it can be seen that substantially less Ge was found in the second layer 2 of strained Si with distance from the interface 12 with the first layer 1' in the context of the measured values compared to those of the theoretical case for a second layer 2 of relaxed Si. This difference in Ge concentration between the measurements and theory becomes even greater with distance from the interface 12 between the two layers. In particular, from a depth of about 10 Å below the interface 12, the differences between theory and the measurements become substantial. These differences are summarized in the table below, giving ratios between the theoretically calculated Ge concentrations and the Ge concentrations that have been measured:

|  | Depth | | |
| --- | --- | --- | --- |
|  | 220 Ångströms | 230 Ångströms | 250 Ångströms |
| Heat treatment at 800° C. | 1/9 | 1/70 | 1/600 |
| Heat treatment at 850° C. | 1/2 | 1/6 | 1/25 |

The differences between the theory and the measurements in the case of prior heat treatment carried out at 750° C. were smaller (see diffusion profiles 62 and 52). Further, a measurement on a sample which had not undergone heat treatment produced a diffusion profile which was substantially identical to that produced for a sample treated at 750° C. Thus, it has been confirmed that the diffusion profile does not change substantially between ambient temperature and 750° C. In contrast, it is now shown herein that the diffusion profiles 62 and 63 tend to be closer to the initial profile (after epitaxy) than the diffusion profiles of the prior art (i.e. diffusion profiles 53, 54).

Figure 3A:
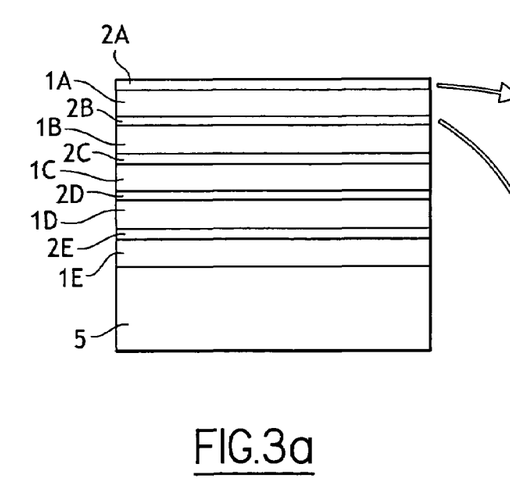
FIGS. 3a and 3b are diagrams of a second variation of the method of the invention.
Figure 5:
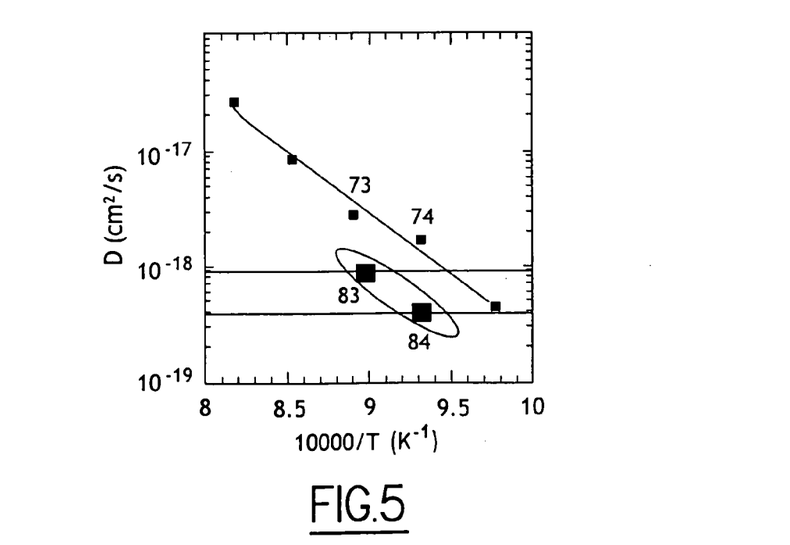
FIG. 5 shows a comparative study of the germanium diffusion coefficients in a layer of unstrained silicon and in a layer of strained silicon.

Referring now to FIG. 5, the diffusion coefficient "0" (in square centimeters per second) (i.e. the y-axis) has been calculated as a function of the temperature of the heat treatment carried out on the samples (the abscissa represents the inverse of the temperature "T" in kelvins multiplied by 10000). Points 83 and 84 respectively show the diffusion coefficients found from the measured diffusion profiles 63 and 64 of FIG. 3. Points 73 and 74 were determined according to the Griglione et al. article previously mentioned herein and correspond to diffusions found after respective heat treatments at 800° C. and 850° C. for four hours. From this data, it can thus be seen that the diffusion coefficients in the second layer 2 of strained Si are of the order of four times lower than in a second layer 2 of relaxed Si at the temperatures under consideration.

The results obtained by the inventors thus show that the diffusion of Ge is surprisingly reduced in the case of a second layer 2 of strained Si compared with the case in which it is of relaxed Si. Post-detachment heat treatments carried out at temperatures higher than those conventionally used can thus be envisaged. This discovery led to the use of a high temperature RTA in accordance with the invention, and has thus demonstrated that its influence on the diffusion of germanium in the second layer 2 of strained Si is much lower than that which could have been deduced from the prior art. Furthermore, carrying out an RTA can thus both reduce post-detachment roughness prior to selective etching, and sufficiently stabilize the bonding interface to limit problems with delamination during the selective etching.

The post-detachment roughness has been limited in the past by being adapted in advance to the implantation conditions, as seen above (co-implantation of H and He) and/or by fracture annealing at 600° C., to reduce the roughness. Furthermore, RTA can result in encapsulation of the oxide layer by smoothing the layer of SiGe on the wafer sides, as described in U.S. patent application Ser. No. 10/784,040 filed Feb. 20, 2004, the content of which is expressly incorporated herein to the extent necessary to understand this feature of the invention. Such an encapsulation further tends to limit delamination problems at the interface at the time of selective etching.

Optionally, as noted above, it is possible to carry out, prior to RTA, sacrificial oxidation of a portion of the first layer 1', which will then have the effect of reducing the thickness of the $Si_{1-x}Ge_x$ to be lifted off by etching and further reducing roughness prior to carrying out RTA. The sacrificial oxidation is typically carried out at a temperature of less than 650° C. The thickness which is lifted off may be around 500 Å to 1500 Å, preferably about 1000 Å, depending on the thickness of the remaining first layer 1'.

Figure 1F:
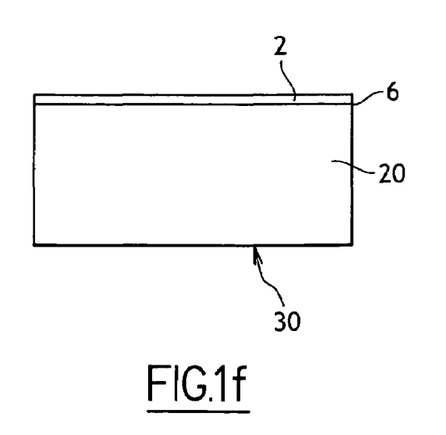

In FIG. 1f, the first layer 1' of $Si_{1-x}Ge_x$ is optionally removed to obtain a final strained $Si_{1-y}Ge_y$ on insulator structure. Optionally, the strained $Si_{1-y}Ge_y$ layer may then be made thicker by epitaxy. To selectively remove the $Si_{1-x}Ge_x$ layer 1', selective chemical etching may be carried out using chemical agents adapted to the materials present. Thus, in a first example, when the second layer 2 is formed of strained Si (i.e., $Si_{1-y}Ge_y$, where y is 0); it is possible to use HF: $H_3O_2$: $CH_3COOH$, SC1 ($NH_4OH/H_2O_3/H_2O$), or HMA (HF/ $HNO_3/H_2O$) to remove the residue of the first layer 1'. A selectivity of about 40:1 between the SiGe and the sSi may be achieved with $CH_3COOH/H_2O_2/HF$. One example of a concentration which may be selected for $QI_3COOH/H_2O_2/$ HF is 4:3:0.25, and for SCI, 1:1:5. The etching time is directly correlated to the rate of etching. It Is typically about 5 minutes for 800 Å to be etched with $CH_3COOH/H_2O_2/HF$.

In a second example, the first layer 1' has a Ge concentration of 20% or less (i.e., $x \leq 0.2$) and the second layer 2 has a Ge concentration of more than 25% (i.e., $y \geq 0.25$); it is then possible to use tetramethyl ammonium hydroxide (TMAH) or potassium hydroxide (KOH) to remove the residue of the first layer 1'.

Carrying out RTA, optionally combined with prior coimplantation and/or plasma activation and/or low temperature heat treatment for reinforcing the bonding interface and/or sacrificial oxidation, having considerably reduced the surface roughness and non-uniformity of thickness in removed layers 1' and 2, thus allows selective etching to be carried out ~'4iich is substantially identical to the prior art, but also dispenses with the disadvantages which could arise, such as the necessity to carry out prior mechanical polishing. Further, reinforcing the bonding (carried out by RTA at least) is sufficient to overcome problems encountered with edge delamination mentioned above. Finally, fine etching of the surface layer of strained $Si_{1-y}Ge_y$ (by SC1 treatment, for example) may follow selective etching to lift a small amount of material into which the Ge could have been able to diffuse.

The method may optionally be terminated by a high temperature stabilization step to close the bonding interface and/or by furnace annealing or RTA to carry out final smoothing of the strained $Si_{1-x}Ge_x$ layer if the roughness subsisting after selective etching has to be further smoothed. Optionally, a final crystal growth step (epitaxy, for example MBE or CVD)) can be carried out to thicken the second layer 2 formed of strained $Si_{1-y}Ge_y$.

Figure 2A:
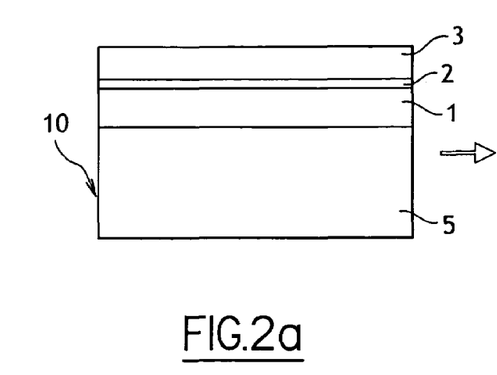
FIGS. 2a and 2b are diagrams of a first variation of the method of the invention.
Figure 2B:
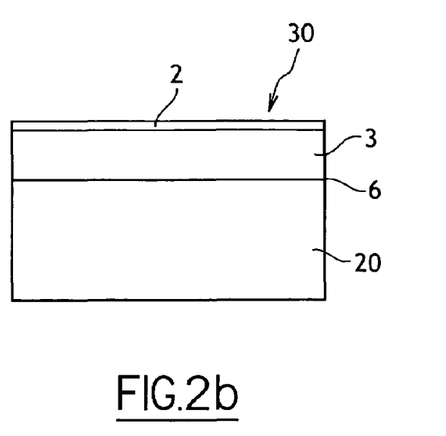

In accordance with a second variation of the invention, referring now to FIGS. 2a and 2b, the donor wafer 10 comprises, in succession prior to removal, a first layer 1 formed of $Si_{1-x}Ge_x$, a second layer 2 formed of strained $Si_{1-y}Ge_y$, then a third layer 3 formed of $Si_{1-y}Ge_y$. The zone of weakness is then formed in accordance with the invention beneath the second layer 2, for example in the first layer 1. Selective etching of the $Si_{1-x}Ge_x$ can then be carried out after RTA, in accordance with the foregoing, to produce a final strained $Si_{1-y}Ge_y/Si_{1-y}Ge_y$ on insulator structure 30 (as shown in FIG. 2b) with a second layer 2 formed of strained $Si_{1-y}Ge_y$ and a third layer 3 formed of $Si_{1-x}Ge_x$. Optionally, the second layer formed of strained $Si_{1-y}Ge_y$ can be rendered thicker by crystal growth. Optionally and alternatively, a second selective strained $Si_{1-y}Ge_y$ chemical etching step may then be carried out.

When x=0 (i.e. the second layer 2 is formed of strained Si), chemical species based, for example, on KOH, $NH_4OH$ (ammonium hydroxide), TMAH, EDP (ethylene diamine/ pyrocatechol/pyrazine) could then be employed. In that case, the second layer 2 formed of strained Si acts only as a stop layer protecting the third layer 3 formed of $Si_{1-x}Ge_x$ from the first chemical attack. A SiGeOI structure 30 (not shown) is thus obtained. Optionally, a layer of strained Si can be grown on the SiGeOI, with the new strained layer possibly then having a crystalline structure of better quality than the first layer 1 which had already been etched.

Figure 3B:
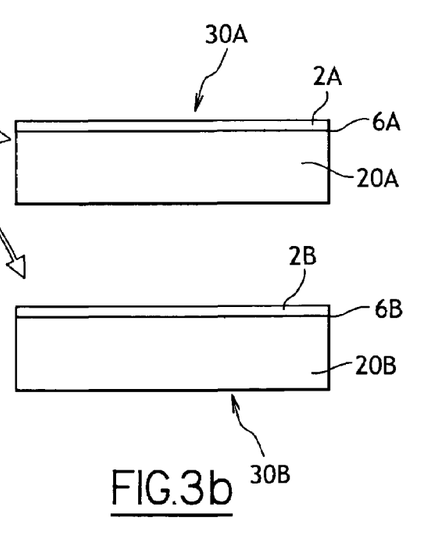

In a third variation of the invention, referring to FIGS. 3a and 3b, the donor wafer 10 comprises, prior to removal, a multilayer structure comprising alternating first layers 1A, 1E, 10, ID, 15 formed of $Si_{1-x}Ge_x$ and second layers 2A, 25, 20, 2D, 25 formed of strained $Si_{1-y}Ge_y$. A plurality of removal steps of the invention can then be carried out from the same donor wafer 10, each removal then being followed by recycling the remaining portion of the donor wafer 10 to prepare it for a fresh removal. Thus, for example, a first structure 30A of strained $Si_{1-y}Ge_y$ on insulator and a second strained $Si_{1-y}Ge_y$ on insulator structure 305 will be formed of the same donor wafer 10. That type of removal is disclosed in U.S. patent application US2004/0053477.

In a particular case of the invention, each strained layer ("2" in FIGS. 1a to 1f, 2a and 2b, and "2A", "25", "20", "2D" or "25" in FIGS. 3a and 3b) of the donor wafer 10 is thick, i.e. its thickness is greater than the critical equilibrium thickness (thickness from which elastic stresses start to relax) without relaxing its elastic strains. This is rendered possible by low temperature epitaxial formation. As an example, a layer of strained Si deposited at temperatures in the range from about 450° C. to 650° C. on a growth support formed of $Si_{0.8}Ge_{0.2}$ may typically reach a thickness in the range from about 30 run to 60 nm without the strains relaxing in one way or another.

If such a thick strained layer is thus formed, care must be taken not to exceed a certain limiting temperature (which is close to the deposition temperature) in the subsequent treatments, and in particular treatments which are between depositing the layer and detaching it by a SMART-CUT® technique, to avoid relaxing the strains.

In this case of a thick strained layer, then, plasma activation prior to bonding (as discussed above) is advantageously carried out at a typical ambient temperature of less than about 100° C. Further, at least one bonding layer of dielectric material such as $SiO_2$ is advantageously formed on one or both surfaces to be bonded, the layer of dielectric material subsequently helping (i.e. after detachment) to retain the elastic strains. As a complement to plasma activation, post-detachment heat treatment at a temperature T (as discussed above) can be carried out, T advantageously being lower than the temperature at which the thick strained layer is deposited in the case in which no bonding layer has been provided.

Clearly, the skilled person could readily implement the invention when minor species are added to the $Si_{1-x}Ge_x$ and $Si_{1-y}Ge_y$ layers, adding, for example, doping species and/or carbon in small quantities (about 5% or less), as is generally known in the art.

What is claimed is:

1. A method for forming a semiconductor structure, which comprises:
   providing a donor wafer that includes a first layer of $Si_{1-x}Ge_x$ and a second layer of $Si_{1-y}Ge_y$ located on the first layer, with x and y respectively, being in the range of 0 to 1, and x being different than y;
   implanting atomic species into the donor wafer to form a zone of weakness in the first layer;
   bonding the donor wafer to a receiver wafer;
   detaching the second layer and a portion of the first layer from the donor wafer by supplying energy to bonded wafers sufficient to cause cleavage at the zone of weakness to form an intermediate structure thereof;
   conducting a rapid thermal anneal of the intermediate structure at a temperature of about 1000° C. or more for a period of time not exceeding 5 minutes; and
   removing any remaining portions of the first layer of the intermediate structure to provide a semiconductor structure comprising the second layer on the receiving wafer.

2. The method of claim 1, wherein the remaining portions of the first layer are removed from the intermediate structure by selective etching.

3. The method of claim 1, wherein the rapid thermal anneal is carried out at a temperature of from about 1000° C. to about 1200° C. for about 10 seconds to about 30 seconds.

4. The method of claim 1, wherein the rapid thermal anneal is carried out in a reducing atmosphere that includes argon and that optionally includes hydrogen.

5. The method of claim 1, which further comprises conducting a sacrificial oxidation before the rapid thermal annealing to remove some of the remaining portions of the first layer of the intermediate structure.

6. The method of claim 1, which further comprises conducting plasma activation of a bonding surface of at least one of the donor wafer or receiving wafer before bonding the two together.

7. The method of claim 1, which further comprises conducting a heat treatment to reinforce bonding of the wafers wherein the heat treatment is carried out prior to the rapid thermal annealing at a temperature of about 350° C. to about 800° C. for about 30 minutes to 4 hours.

8. The method of claim 7, wherein the heat treatment is carried out after the detaching but continuously with the detaching, by simply changing the temperature from one that causes detaching to one that reinforces bonding of the wafers.

9. The method of claim 1, which further comprises conducting a heat treatment to reinforce bonding of the wafers, wherein the heat treatment is carried out after removing remaining portions of the first layer and at a temperature of about 1000° C. to about 1100° C. for about 2 hours.

10. The method of claim 1, wherein the implanted atomic species is hydrogen ions and the hydrogen ions are implanted at a dose of $3 \times 10^{16}$ atoms/cm$^2$ to $10 \times 10^{16}$ atoms/cm$^2$, and at an implantation energy of 20 keV to 80 keV.

11. The method of claim 1, wherein the implanted atomic species comprises a co-implantation of helium and hydrogen ions, and the helium and hydrogen ions are implanted at a dose of $1 \times 10^{16}$ atoms/cm$^2$ and $1 \times 10^{16}$ atoms/cm$^2$, respectively, and at implantation energies for each of 20 keV to 80 keV.

12. The method of claim 1 which further comprises growing additional $Si_{1-y}Ge_y$ on the second layer of the semiconductor structure after the removing step to thicken the second layer.

13. The method of claim 12, wherein the second layer is formed of elastically strained $Si_{1-y}Ge_y$, and the donor wafer comprises a support substrate formed of bulk Si and a SiGe buffer structure beneath the first and second layers.

14. The method of claim 1 wherein the donor wafer further comprises a third layer formed of $Si_{1-x}Ge_x$ on the second layer where x is between 0 and 1.

15. The method of claim 13, which further comprises selective etching of the second layer as opposed to the third layer.

16. The method of claim 1, wherein the donor wafer comprises a support substrate formed of bulk Si, a SiGe buffer structure and a multilayer structure comprising alternating first layers formed of $Si_{1-x}Ge_x$ and second layers formed of strained $Si_{1-y}Ge_y$ to allow a plurality of removals to be made from the same donor wafer.

17. The method of claim 16, wherein each layer of strained $Si_{1-y}Ge_y$ is thicker than a critical equilibrium thickness where elastic stresses in the layer would otherwise start to relax.

18. The method of claim 16, wherein prior to implanting, further comprises forming the strained layer at a deposition temperature of about 450° C. to about 650° C., wherein any treatments carried out between the forming and detaching steps are implemented at temperatures that are less than or equal to the deposition temperature.

19. The method of claim 12, wherein y equals 0.

20. The method of claim 1, wherein prior to bonding, the method further comprises a step of providing a bonding layer on the donor wafer, on the receiver wafer or on both, with the bonding layer comprising an electrically insulating oxide, nitride or oxynitride material.

* * * * *